(12) United States Patent
Herrmann et al.

(10) Patent No.: US 8,288,733 B2
(45) Date of Patent: Oct. 16, 2012

(54) RADIATION SENSITIVE DETECTOR

(75) Inventors: Christoph Herrmann, Aachen (DE); Rainer Kiewitt, Aachen (DE); Michael Overdick, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 642 days.

(21) Appl. No.: 12/523,196

(22) PCT Filed: Jan. 10, 2008

(86) PCT No.: PCT/IB2008/050088
§ 371 (c)(1),
(2), (4) Date: Jul. 15, 2009

(87) PCT Pub. No.: WO2008/093252
PCT Pub. Date: Aug. 7, 2008

(65) Prior Publication Data
US 2010/0140491 A1    Jun. 10, 2010

Related U.S. Application Data

(60) Provisional application No. 60/887,354, filed on Jan. 31, 2007.

(51) Int. Cl.
*G01T 1/24* (2006.01)
*H05G 1/64* (2006.01)

(52) U.S. Cl. .................. 250/370.09; 378/98.8; 378/98.9

(58) Field of Classification Search ............ 250/370.09; 378/98.8, 98.9
See application file for complete search history.

(56) References Cited

U.S. PATENT DOCUMENTS

| | | | | |
|---|---|---|---|---|
| 6,426,991 | B1 * | 7/2002 | Mattson et al. | 378/19 |
| 6,510,195 | B1 * | 1/2003 | Chappo et al. | 378/19 |
| 2004/0206886 | A1 | 10/2004 | Carlson et al. | |
| 2004/0222358 | A1 | 11/2004 | Bui et al. | |

(Continued)

FOREIGN PATENT DOCUMENTS

| | | |
|---|---|---|
| WO | 02054955 A2 | 7/2002 |
| WO | 2004099740 A2 | 11/2004 |

OTHER PUBLICATIONS

Cheng et al., Electrical Through Silicon Wafer Interconnects for High Frequency Photonic Devices,presentation, Khuri-Yakub Group, Stanford University, IEEE Components, Packaging and Manufacturing Technology Society, published on or before download date Jan. 23, 2007, http://www.stanford.edu/group/SPRC/Report/poster/cheng.pdf.

(Continued)

*Primary Examiner* — David Porta
*Assistant Examiner* — Mindy Vu

(57) ABSTRACT

An apparatus includes an x-ray source (112) that generates transmission radiation that traverses an examination region (108) and a detector (116) that includes a photo-converter (204) that detects the radiation and generates a signal indicative thereof. The photo-converter (204) includes a light receiving region (260) on a back side (264).5The light receiving region receives light indicative of the detected radiation. The photo-converter (204) further includes read-out electronics (240) within a front side (228), which is located opposite the back side (264). The read-out electronics (240) process a photo-current indicative of the received light to generate the signal indicative of the detected radiation. The photo-converter (204) further includes a photodiode (208, 212, 232) 10disposed between the light receiving region (260) and the read-out electronics (240). The photodiode (212) produces the photo-current. A reconstructor (128) reconstructs the signal to generate image data indicative of the examination region (108).

24 Claims, 4 Drawing Sheets

U.S. PATENT DOCUMENTS

2005/0029561 A1      2/2005   Suzuki et al.
2006/0255279 A1*    11/2006   Simon et al. ............. 250/370.09
2008/0049892 A1*     2/2008   Maltz .............................. 378/19

OTHER PUBLICATIONS

Holland, S. E., et al.; Development of Low Noise, Back-Side Illuminated Silicon Photodiode Arrays; 1997; IEEE Trans. on Nuclear Science; 44(3)443-447.

Niclass et al., Toward a 3-D Camera Based on Single Photon Avalanche Diodes, IEEE Journal of Selected Topics in Quantum Electronics, Jul./Aug. 2004, pp. 796-802, vol. 10, No. 4.

Rochas et al., First Fully Integrated 2-D Array of Single-Photon Detectors in Standard CMOS Technology, IEEE Photonics Technology Letters, Jul. 2003, pp. 963-965, vol. 15, No. 7.

* cited by examiner

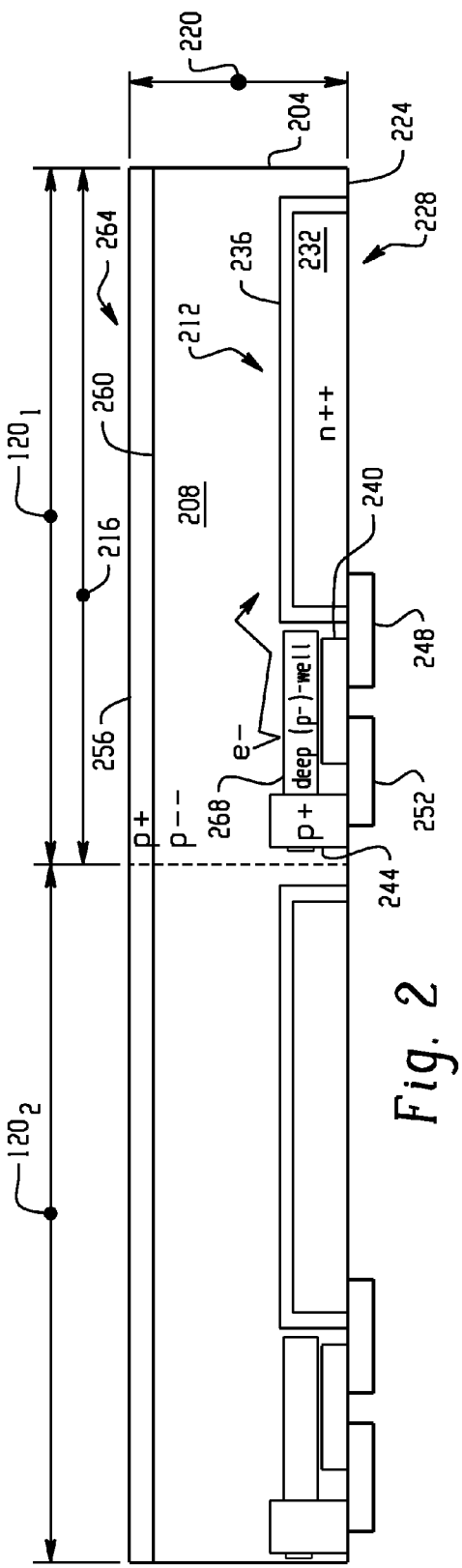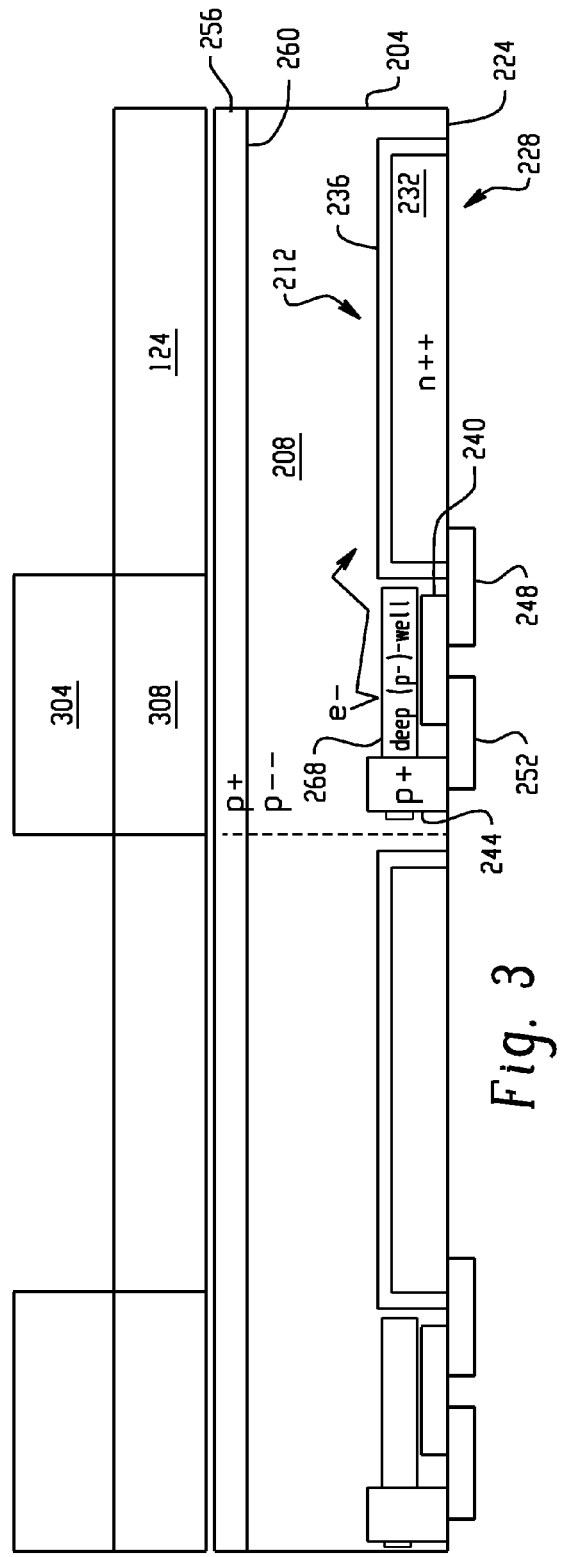

RADIATION SENSITIVE DETECTOR

CROSS REFERENCE TO RELATED APPLICATIONS

This application claims the benefit of U.S. provisional application Ser. No. 60/887,354 filed Jan. 31, 2007, which is incorporated herein by reference.

The present application generally relates to radiation sensitive detectors. While it is described with particular application to a computer tomography (CT) system, it also relates to other applications in which it is desirable to detect radiation and generate a signal indicative of the detected radiation.

X-ray computed tomography (CT) systems have included a two-dimensional detector having a plurality of slices, or rows of detector elements. For instance, exemplary systems have included sixteen (16), thirty-two (32), or sixty-four (64) rows, as well as other numbers of rows of detector elements.

A suitable detector element includes a photodiode that converts light generated by a scintillator to a corresponding electrical current, or photo-current. One such photodiode is a back illuminated photodiode (BIP), which generally receives light on a first (or back) side and conveys the corresponding electrical current through electrical contacts on a second (or front) side, which is located opposite the first side. The front side is usually the side on which the CMOS processing steps are performed e.g. the processing circuitry, while on the backside, usually no circuitry is implemented. Using a photodiode with electrical contacts in a side (the front side) opposite light receiving side (the back side) allows individual detector elements within a matrix of such detector elements to be butted (on all 4 sides) relatively close together since the detector elements do not need to be spaced apart to accommodate electrically conductive traces that would otherwise carry the electrical current from the photodiode to read-out electronics. Reducing the space between the detector elements may increase the light receiving region per unit area.

A BIP has been electrically connected to an integrated circuit having read-out electronics via the electrical contacts of the BIP and electrical contacts of the integrated circuit. However, the electrical connection between the contacts may introduce electronic noise. Such noise, at low electrical current levels, may be greater than the quantum noise. As a consequence, quantum limited operation may not be achievable over the input signal range; although it may be achievable for relatively higher electrical current levels.

Read-out electronics have also been integrated with a BIP in a common substrate, thereby mitigating electronic noise introduced by the electrical connection. Unfortunately, the read-out electronics may require a more expensive CMOS process relative to the CMOS process used to form the BIP, and using the relatively more expensive CMOS process to form a BIP with integrated read-out electronics may increase BIP manufacturing costs. In addition, the integrated read-out electronics may occupy space within a detector element that could otherwise be used to receive radiation, and thus may reduce the effective light receiving area of the photodiode. Moreover, the space available for the read-out electronics may be limited such that only a sub-set of the read-out electronics can be integrated therein.

Aspects of the present application address the above-referenced matters and others.

According to one aspect, an apparatus includes an x-ray source that generates transmission radiation that traverses an examination region and a detector that includes a photo-converter that detects the radiation and generates a signal indicative thereof. The photo-converter includes a light receiving region on a back side. The light receiving region receives light indicative of the detected radiation. The photo-converter further includes read-out electronics within a front side, which is located opposite the back side. The read-out electronics process a photo-current indicative of the received light to generate the signal indicative of the detected radiation. The photo-converter further includes a photodiode disposed between the light receiving region and the read-out electronics. The photodiode produces the photo-current. A reconstructor reconstructs the signal to generate image data indicative of the examination region.

In another aspect, an apparatus includes an x-ray source that generates transmission radiation that traverses the examination region and a detector that includes a semiconductor substrate that detects the radiation and generates a signal indicative thereof. The semiconductor substrate includes a light receiving region on a back side. The light receiving region receives light indicative of the received radiation. The semiconductor substrate further includes a photodiode that produces a photo-current indicative of the light, read-out electronics within a front side that process the photo-current to generate the signal, and a barrier located between the back side and the read-out electronics. The barrier shields the read-out electronics from charge in a p-doped epi-taxial region of the photodiode. A reconstructor reconstructs the signal to generate image data indicative of the examination region.

In another aspect, a method includes a method including receiving light in a volume of a back side of a photo-converter, producing a photo-current signal indicative of the light using a photodiode of the photo-converter, and outputting a signal indicative of the photo-current with read-out electronics located on a front side of the photo-converter. The front side is located opposite the back side, and a charge barrier resides between the volume and the read-out electronics and closer to the read-out electronics.

In another aspect, a radiation sensitive detector element includes a light receiving region, located on a back side of the detector element, that receives light. A photodiode, disposed within the detector element, produces a photo-current indicative of the light. Read-out electronics are located on a front side of the detector element so that the photodiode is between the light receiving region and the read-out electronics and process the photo-current to generate a signal indicative thereof. The photodiode and the read-out electronics are formed in a common substrate.

In another aspect, a radiation sensitive detector element includes a light receiving region, located on a back side of the detector element, that receives light. A photodiode, disposed within the detector element, produces a photo-current indicative of the light. Read-out electronics, located on a front side of the detector element, process the photo-current to generate a signal indicative thereof. A charge barrier is disposed between the light receiving region and the read-out electronics. The photodiode, the read-out electronics, and the charge barrier are formed in a common substrate (204).

Still further aspects of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIGS. 2 and 3 illustrate an exemplary photo-electric converter.

Figure 1:
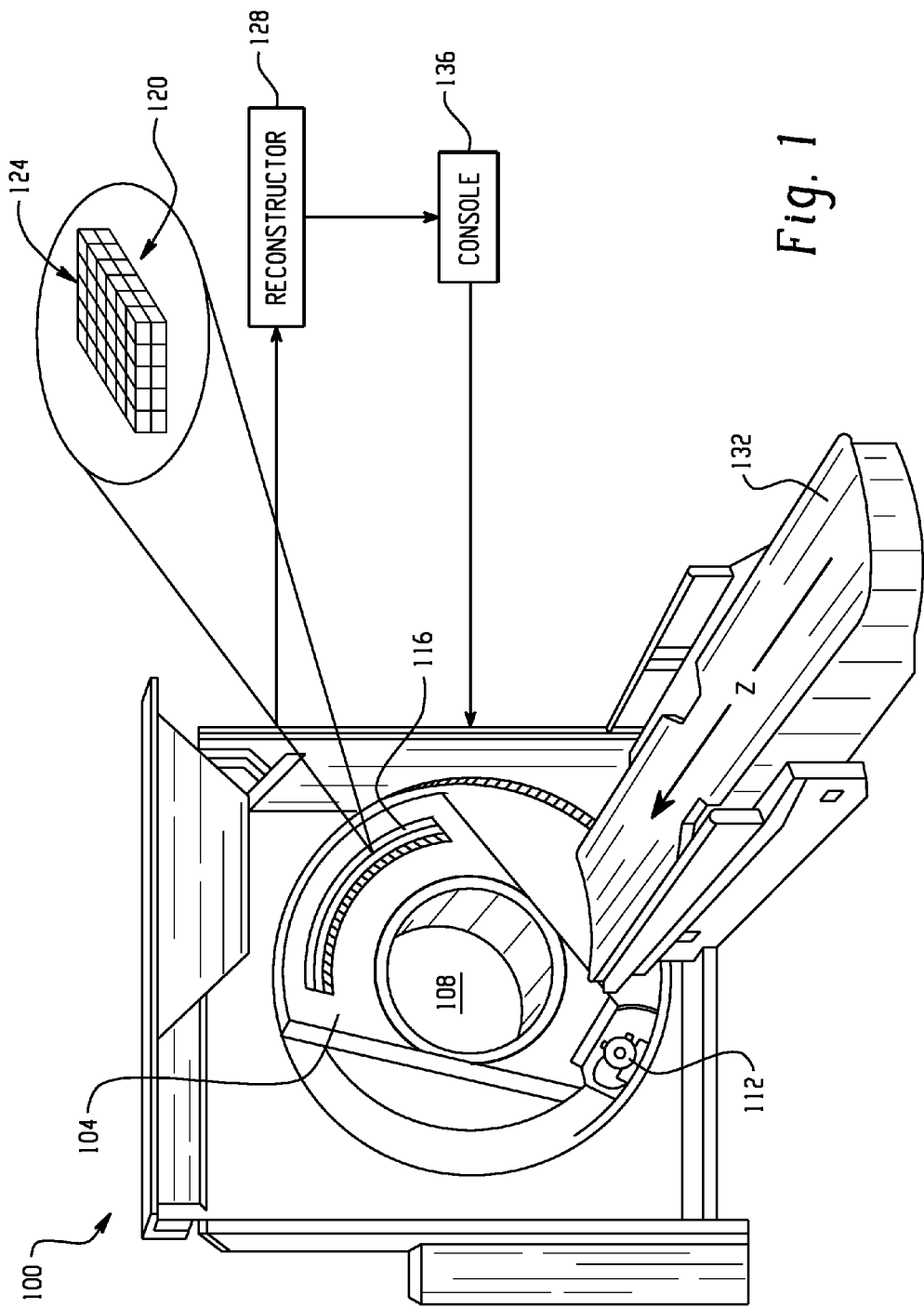
FIG. 1 illustrates an exemplary imaging system.

With reference to FIG. 1, a computed tomography (CT) system 100 includes a rotating gantry portion 104 which rotates about an examination region 108 around a longitudinal or z-axis. The rotating gantry portion 104 supports an x-ray source 112, such as an x-ray tube, that generates and emits radiation that traverses the examination region 108.

The rotating gantry portion 104 also supports an x-ray detector 116. The detector 116 receives x-ray photons or radiation emitted by the source 112 for a plurality of projection angles or views so that x-ray projections are obtained over at least one hundred and eighty (180) degrees plus a fan angle.

The detector 116 is a multi-slice detector that includes a matrix of detector pixels or elements 120, including a plurality of rows of detector elements 120 that extend in the longitudinal direction and a plurality of columns of detector elements 120 that extend in a traverse direction. Generally, the number of rows of detector elements define a number of slices that can be scanned, and, hence, the scan volume, for a given data acquisition cycle.

In the illustrated embodiment, the detector elements advantageously include back-illuminated photodiodes (BIPs) having integrated detector read-out electronics such as an integrator, an analog-to-digital converter, and an amplifier, as well as other active and passive electrical components. The BIP and read-out electronics are integrated in that they are formed in a common substrate. The BIP receives light indicative of a detected x-ray photon and produces an electrical current, or photo-current, corresponding thereto. The integrated read-out electronics process the electrical current and generates a signal indicative thereof.

A matrix of corresponding rows and columns of scintillators 124 are in optical communication with the rows and columns of detector elements 120. The scintillators 124 receive the x-ray radiation and produce light indicative thereof. An anti-scatter grid (ASG) and/or shield may be used to block scatter and/or other extraneous radiation from striking the scintillators 124.

A reconstructor 128 reconstructs the projection data to generate volumetric image data. The volumetric image data is indicative of the examination region 108.

An object support 132 such as a couch supports a patient or other object in the examination region 108. The object support 132 is movable so as to guide the object within respect to the examination region 108 while performing a scanning procedure.

A general purpose computer serves as an operator console 136. The console 136 includes a human readable output device such as a monitor or display and an input device such as a keyboard and mouse. Software resident on the console allows the operator to control and interact with the scanner 100, for example, through a graphical user interface (GUI).

As noted above, the illustrated detector 116 includes the matrix of detector elements 120. FIG. 2 illustrates an expanded view of two adjacent detector elements $120_1$ and $120_2$ within a matrix of the detector elements 120, and the following describes the detector elements 120 in greater detail in relation to the detector element $120_1$. As depicted, the detector element $120_1$ includes a photo-converter or semiconductor substrate 204 having a (p--) doped epi-taxial layer 208. The (p--) doped epi-taxial layer 208 advantageously has a resistivity that mitigates recombination of charge or electron-hole pairs before they reach a pn junction 212. The electron-hole pairs are generated from the interaction of light with the (p--) doped epi-taxial layer 208. The illustrated (p--) doped epi-taxial layer 208 has a diffusion length 216 of about 700-1000 microns and a thickness 220 of about 120 microns or less. In another embodiment, the thickness is about one tenth of the diffusion length value.

Next to a first surface 224 of a first or front side 228 of the substrate 204 and within the (p--) doped epi-taxial layer 208 is an n++ doped n-well 232 that together with the (p--) doped epi-taxial layer 208 forms a photodiode having a pn junction 212 with a depletion region 236. In this example, the n++ doped n-well 232 behaves as a cathode for the photodiode. A p+ region 244, also next to the surface 224 and within the epi-taxial layer 208, behaves as an anode for the photodiode.

Read-out electronics 244, including an integrator, an analog-to-digital converter, an amplifier, as well as other active and passive components, also reside next to the surface 224 and within the (p--) doped epi-taxial layer 208. The read-out electronics 240 are physically separated from the n++ doped n-well 232 (cathode) and the p+ region 244 (anode) within the (p--) doped epi-taxial layer 208 by a portion of the (p--) doped epi-taxial layer 208. Electrically conductive contacts 248 and 252 respectively electrically connect the n++ doped n-well 232 (cathode) and the p+ region 244 (anode) to the read-out electronics 240.

The substrate 204 further includes a relatively thin p+ doped diffusion layer 256 on a second volume 260 of a second or back side 264 of the (p--) doped epi-taxial layer 208. The p+ doped diffusion layer 256 provides a potential barrier at the volume 260 that encourages electrons to diffuse towards the pn junction 212 rather than recombine. As a consequence, the p+ doped diffusion layer 256 may reduce recombination of electron-hole pairs near the surface of the device's back-side.

An optional deep p-- well 268 is advantageously located between the back side 264 and the read-out electronics 240 to provide an electrical barrier that shields charge from diffusing to the read-out electronics 240 rather than to the photodiode pn-junction 212. Diffusion of such charge may cause electrical disturbances in the read-out electronics.

The feature size and electrical components of the read-out electronics 240 are advantageously selected so that a relatively less expensive CMOS process is used to form the photodiode and suitable read-out electronics in the common substrate 204. For instance, the feature size and electrical components of the read-out electronics 240 may be advantageously selected so that a 0.8 micron CMOS process as opposed to a 0.18 micron CMOS process can be used to form the photodiode and read-out electronics in the common substrate 204. Of course, other CMOS processes such as 0.5, 0.35 and 0.25 CMOS processes are also contemplated herein. On the other hand, a 0.18 micron CMOS process may be superior to bigger feature sizes processes with respect to radiation hardness.

Detector elements 120 used with CT systems such as the CT system 100 as well as other systems have had a photodiode fill-factor of about 75% of the diffusion length 216, which leaves about 25% of the area available for read-out electronics. In the illustrated substrate 204, 25% of such area generally provides sufficient space for forming the read-out electronics 240 with a relatively less expensive CMOS process. Other photodiode fill-factors are also contemplated herein.

As shown in FIG. 3, in one instance the area used for the read-out electronics advantageously coincides with an anti-scatter grid 304 and/or shield 308 coupled to the detector element 120 along with the scintillators 124. As a result, suitable read-out electronics 240 are integrated with the substrate 204 without reducing the effective light-receiving area. In addition, the ASG 304 and/or shield 308 may block radiation that would otherwise strike the read-out electronics 240, which may reduce a need for radiation-hard electronics that may consume more area and increase cost.

Figure 4:
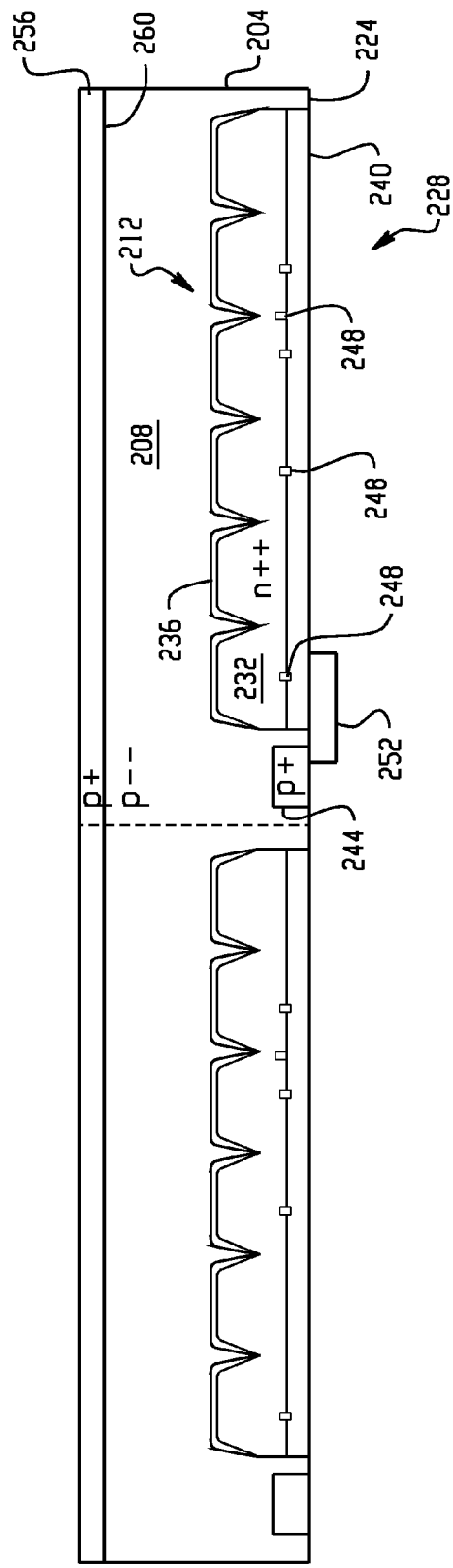
FIG. 4 illustrates an exemplary photo-electric converter.

In an alternative embodiment shown in FIG. 4, the n++ doped n-well 212 is buried within the (p--) doped epi-taxial layer 208 between the back side 260 and the read-out electronics 240, which are again located next to the surface 224 and within the (p--) doped epi-taxial layer 208. One or more of the electrically conductive contacts 248, which electrically couple the pn-junction 212 to the read-out electronics, reside within the (p--) doped epi-taxial layer 208. By positioning the read-out electronics 240 as such, a larger area for the read-out electronics 240, relative to that shown in FIGS. 2 and 3, is available. In addition, the n++ doped n-well 212 shields the read-out electronics 240 from charge that may otherwise recombine within and/or otherwise disturb the read-out electronics 240.

It is to be appreciated that the size and shape of the various elements discussed in connection with FIGS. 1-4 are illustrative and not limiting. In addition, the above is discussed relative to CMOS technology using a p-substrate. However, embodiments employing an n-substrate are also contemplated herein. In the case of n-substrates, the structures would be "complementary" to the structures described herein. For example, the pn-junction would be implemented by a p-well.

Figure 5:
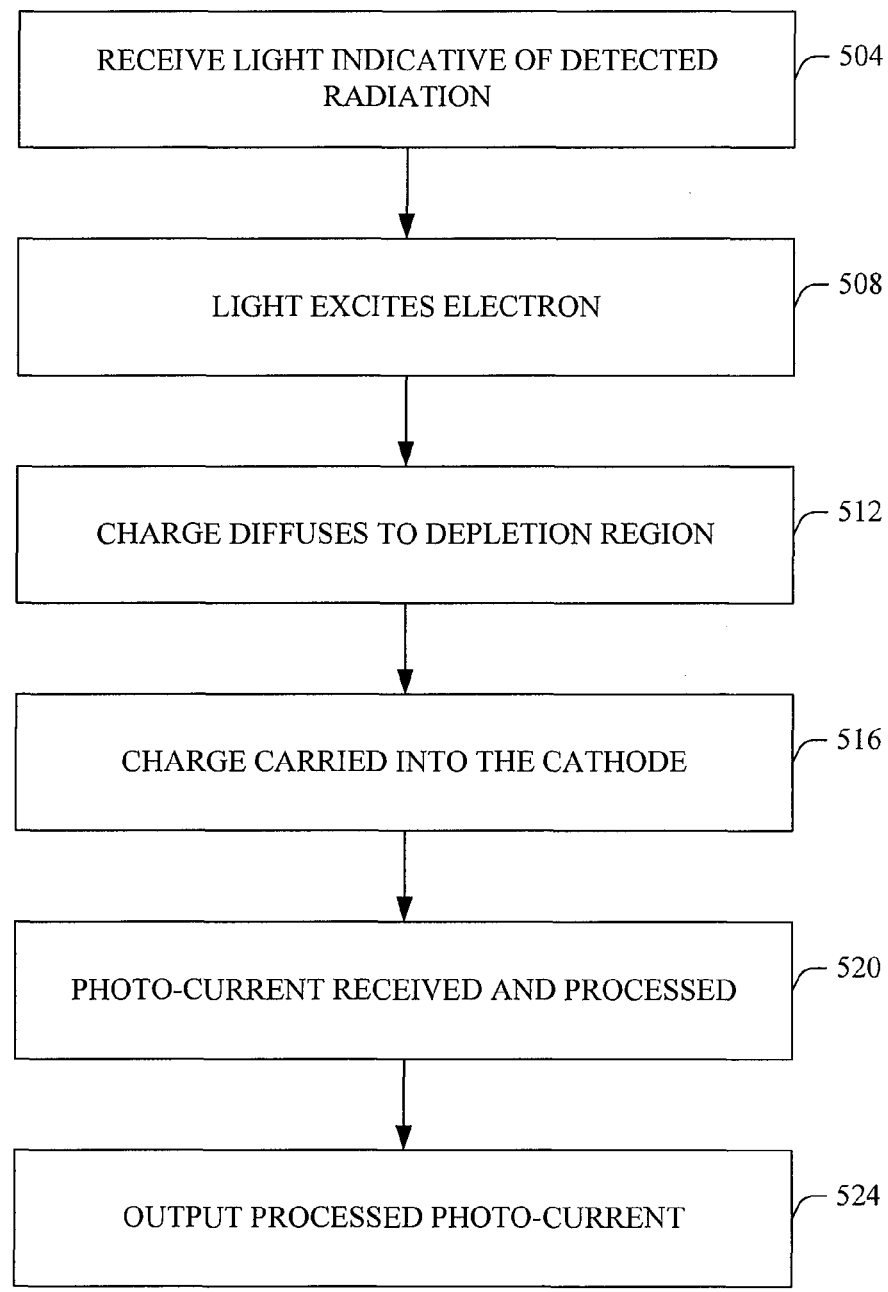
FIG. 5 illustrates an exemplary method.

Operation of the detector element 120 is now described in connection with FIG. 5.

At 504, light indicative of detected x-ray radiation is received by the (p--) doped epi-taxial layer 208.

At 508, the light excites an electron within the (p--) doped epi-taxial layer 208, thereby generating charge.

At 512, the charge diffuses to the depletion region 236 of the pn-junction 212.

At 516, the charge is carried into the n++ doped n-well 212 (cathode), thereby producing a photo-current indicative of the received radiation.

At 520, the photo-current is received and processed by the read-out electronics 240.

At 524, the processed photo-current, or a signal indicative of the photo-current is output from the detector element 120.

Applications of the forgoing and variations thereof include, but are not limited to, CT, x-ray, nuclear medicine, and camera applications, as well as applications including other imaging modalities that detect radiation.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. An apparatus, comprising:
   an x-ray source that generates transmission radiation that traverses an examination region;
   a detector that includes a photo-converter that detects the radiation and generates a signal indicative thereof, wherein the photo-converter includes:
      a light receiving region on a back side, wherein the light receiving region receives light indicative of the detected radiation,
      read-out electronics within a front side, which is located opposite the back side, wherein the read-out electronics process a photo-current indicative of the received light to generate the signal indicative of the detected radiation, and
      a photodiode disposed between the light receiving region and the read-out electronics, wherein the photodiode produces the photo-current; and
   a reconstructor that reconstructs the signal to generate image data indicative of the examination region.

2. The apparatus of claim 1, wherein the photodiode is a back-illuminated photodiode, wherein the back-illuminated photodiode and the read-out electronics are in a common substrate.

3. The apparatus of claim 1, wherein an n-well region of the photodiode shields the read-out electronics from excited electrons in an epi-taxial region of the photodiode.

4. The apparatus of claim 1, wherein the read-out electronics include an integrator and an analog-to-digital converter.

5. The apparatus of claim 1, wherein an n-well region of the photodiode shields the read-out electronics from charge diffusion in an epi-taxial layer of the photodiode.

6. The apparatus of claim 1, wherein the photodiode includes a doped p-type semiconductor region in communication with a doped n-type semiconductor region.

7. The apparatus of claim 1, wherein a p-type semiconductor region of the photodiode has a diffusion length of minority charge carriers of about 700 to 1000 microns.

8. The apparatus of claim 1, wherein a p-type semiconductor region of the photodiode has a thickness that is about one tenth of a diffusion length of minority charge carriers.

9. The apparatus of claim 1, wherein the detector further includes at least a second photo-converter, wherein the photo-converters are physically coupled to form an array of detector elements.

10. The apparatus of claim 1, wherein the photo-converter further includes a layer that reduces recombination of electron-hole carriers at the light receiving region.

11. A method, comprising:
   receiving light in a volume of a back side of a photo-converter;
   producing a photo-current signal indicative of the light using a photodiode of the photo-converter; and
   outputting a signal indicative of the photo-current with read-out electronics located on a front side of the photo-converter;
   wherein the front side is located opposite the back side, and wherein a charge barrier resides between the volume and the read-out electronics and closer to the read-out electronics.

12. The method of claim 11, wherein the charge barrier includes a doped n-well.

13. The method of claim 11, wherein an n-type region of the photodiode is the charge barrier.

14. The method of claim 11, wherein the charge barrier includes a doped p-well.

15. The method of claim 11, wherein the barrier shields the read-out electronics from diffusing charge within the photodiode.

16. A radiation sensitive detector element, comprising:
   a light receiving region, located on a back side of the detector element, that receives light;
   a photodiode, disposed within the detector element, that produces a photo-current indicative of the light; and
   read-out electronics, located on a front side of the detector element so that the photodiode is between the light receiving region and the read-out electronics, that process the photo-current and generate a signal indicative thereof;
   wherein the photodiode and the read-out electronics are formed in a common substrate.

17. The radiation sensitive detector element of claim 16, wherein an n-type region of the photodiode shields the read-out electronics from electrons within the photodiode that are excited by the light.

18. The radiation sensitive detector element of claim 16, wherein the photodiode and the read-out electronics are formed using a 0.8 micron CMOS process.

19. The radiation sensitive detector element of claim 16, further including a barrier layer, operative to the light receiving region, that reduces recombination of electron-hole carriers at the light receiving region.

20. The radiation sensitive detector element of claim 16, wherein the radiation sensitive detector element is employed in a medical imaging scanner.

21. The radiation sensitive detector element of claim 16, wherein the radiation sensitive detector element includes a back-illuminated photodiode and read-out electronics formed in a common substrate.

22. A radiation sensitive detector element, comprising:
a light receiving region, located on a back side of the detector element, that receives light;
a photodiode, disposed within the detector element, that produces a photo-current indicative of the light;
read-out electronics, located on a front side of the detector element, that process the photo-current to generate a signal indicative thereof; and
a charge barrier disposed between the light receiving region and the read-out electronics;
wherein the photodiode, the read-out electronics, and the charge barrier are formed in a common substrate.

23. The radiation sensitive detector element of claim 22, wherein the barrier shields the read-out electronics from charge diffusion in the photodiode.

24. The radiation sensitive detector element of claim 22, wherein the radiation sensitive detector element includes a back-illuminated photodiode and read-out electronics formed in a common substrate.

* * * * *